(12) United States Patent
Kossel et al.

(10) Patent No.: US 8,421,573 B2
(45) Date of Patent: *Apr. 16, 2013

(54) INDUCTOR COMBINING PRIMARY AND SECONDARY COILS WITH PHASE SHIFTING

(75) Inventors: Marcel A. Kossel, Reichenburg (CH); Thomas E. Morf, Einsiedein (CH); Martin Leo Schmatz, Rueschlikon (CH); Jonas R. Weiss, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 1066 days.

This patent is subject to a terminal disclaimer.

(21) Appl. No.: 12/367,008

(22) Filed: Feb. 6, 2009

(65) Prior Publication Data
US 2009/0201100 A1 Aug. 13, 2009

(30) Foreign Application Priority Data
Feb. 12, 2008 (EP) .................................... 08101514

(51) Int. Cl.
*H01F 5/00* (2006.01)
*H01F 27/28* (2006.01)

(52) U.S. Cl.
USPC .......................................... 336/200; 336/232

(58) Field of Classification Search .................. 333/138; 336/200, 232, 222, 230
See application file for complete search history.

(56) References Cited

U.S. PATENT DOCUMENTS

| | | | |
|---|---|---|---|
| 5,872,489 A * | 2/1999 | Chang et al. | 331/179 |
| 5,912,596 A * | 6/1999 | Ghoshal | 331/117 R |
| 6,549,096 B2 | 4/2003 | Groves et al. | |
| 7,902,934 B2 * | 3/2011 | Nakamura et al. | 331/181 |
| 8,018,312 B2 * | 9/2011 | Kossel et al. | 336/200 |
| 2006/0033587 A1 * | 2/2006 | Cabanillas | 331/108 C |

* cited by examiner

*Primary Examiner* — Dean O Takaoka
*Assistant Examiner* — Alan Wong
(74) *Attorney, Agent, or Firm* — Tutunjian & Bitetto, P.C.; Gail Zarick

(57) ABSTRACT

An inductor including a primary coil coaxially arranged and operated in parallel with isolated secondary coils each including at least one loop winding with two open-circuited ports. At least one phase shifting device is arranged between open-circuited ports of at least one secondary coil. A method to operate an inductor by combining primary and secondary coils with phase shifting devices to get a wide tuning range is also provided. The method includes the step of phase shifting open-circuited ports of at least one secondary coil.

5 Claims, 9 Drawing Sheets

Fig. 1 (State of the Art)

INDUCTOR COMBINING PRIMARY AND SECONDARY COILS WITH PHASE SHIFTING

CROSS REFERENCE TO RELATED APPLICATION

This application claims priority under 35 U.S.C. 119 from European Patent Application 08101514.1 filed Feb. 12, 2008, the entire contents of which are incorporated herein by reference.

BACKGROUND OF THE INVENTION

1. Field of the Invention

The invention is related to the design of tunable inductor coils used in inductance-capacitance (LC) tank voltage controlled oscillators (VCO) and phase-locked-loop (PLL) circuits.

2. Description of Related Art

Phase noise and timing jitter are of importance in the design of oscillators and frequency synthesizers. A known method to design high performance clock sources is to use LC-tank oscillators, which are able to achieve better phase noise performance than ring oscillators because of the higher quality factor (Q-factor) of the LC-tank. In wireline communication however where often multiple standards with partially widely spaced frequency ranges have to be covered, the application of LC VCOs is rather difficult since the tuning range of LC-tank oscillators is limited to about 30% if regular LC-tank topologies are used.

It would therefore be desirable to increase the tuning range of LC-tanks to extend the frequency ranges of LC VCOs.

One way of increasing the tuning range of LC-tanks is to use more varactor (variable capacitor) banks, which would increase the variation of the capacitance in the LC tank.

This method is however practically limited by the capacitive and resistive parasitics that occur when increasing the number of varactor banks. The additional capacitive parasitics would decrease the Cmax/Cmin-ratio of the actual tuning varactor and the resistive parasitics would degrade the quality factor disproportionately because of the longer wiring traces required to connect the different varactor banks to the inductor coil and the other devices of the LC VCO.

Moreover the peak of the quality factor of the varactor bank is at relatively low frequencies because the varactor impedance is inversely proportional to the frequency ($Z_{var} \sim 1/2\pi fC$) and the varactor quality factor decreases with increasing frequency. This is in contrast to the inductor where the peak of the quality factor is typically at higher frequencies because the inductor impedance changes proportionally to the frequency ($Z_{ind} \sim 2\pi fL$). At lower frequencies the overall quality factor of the LC-tank given by $$\frac{1}{Q_{LC\_tank}} = \frac{1}{Q_{Varactor}} + \frac{1}{Q_{Inductor}} = \frac{\Re(Z_{LC\_tank})}{\Im(Z_{LC\_tank})}$$

is dominated by the quality factor of the inductor whereas at higher frequencies $Q_{LC\_tank}$ is mainly determined by the quality factor of the varactor. This implies that for the operation of a LC VCO at higher frequencies the tuning or band selection should preferably be performed with a tunable or switchable inductor instead of a set of switchable varactor banks as this is typically implemented in state-of-the-art LC oscillators.

However, switching of inductor coils does degrade the quality factor because of the resistive losses of the closed switches. But if implemented appropriately the degradation of the quality factor is not that high so that the resulting quality factor of the switched inductor coil would not become smaller than the quality factor of the varactor bank at the frequency of interest. This statement is valid up to a certain frequency. At extremely high frequencies the LC VCO cannot be operated anymore for instance because of frequency divider limitations in a PLL circuit. Additionally other parasitics like bridging capacitances across the inductors come into play that degrade the quality factor. Within a reasonably wide frequency range however the performance of a switchable inductor outperforms that of a switchable varactor bank.

There are two types of switchable inductors: either a switch is series-connected with a self-inductance coil or the switch is located within a secondary isolated coil. Both types of switchable inductors are shown in FIG. 1, wherein P1 and P2 denote outer ports of the switchable inductors.

Referring to FIG. 1, in the switchable coil configuration 01 the switch 02 is series-connected with the self-inductance coil 04. The switch 02 bypasses the inner coil winding 03 of the two-winding-coil 11. If the switch 02 is closed the current flows only in the outer winding 04, which is the primary coil 04 of the two-winding-coil 11, and the inner winding 03, which is the secondary coil 03 of the two-winding-coil 11, is short-circuited and disconnected from the outer winding 04. If the switch 02 is opened, the two-winding-coil 11 is operated like a regular multi-turn coil because both coils 03 and 04 become series-connected.

In the switchable coil configuration 05 shown in FIG. 1(b) the mutual inductance is switched, i.e. the switch 06 is located in the mutual inductance coil 07, which is the secondary coil 07. If the switch 06 in the secondary coil 07 is opened, only the self-inductance of the primary coil 08 contributes to the overall inductance. However if the switch 06 is closed, the current induced in the secondary coil 07 generates a mutual inductance that reduces the self-inductance of the primary coil 08 so that the overall inductance becomes smaller.

The two basic principles of switching an inductor coil can be analyzed based on the lumped element equivalent circuits 09, 10, which are shown in FIGS. 1(c) and 1(d). For equal coil geometries—despite differently connected—and closed switches, it can be shown that:

a) the resulting overall inductance of both switchable coil configurations 01 and 05 is the same but b) the right-hand side inductor 05 and the switchable coil configuration 05 respectively has a higher quality factor.

This is caused by the fact that the switch resistance in the closed state does not get transformed one-to-one from the secondary coil 07 to the primary coil 08 in the right-hand side switchable inductor 05. This is in contrast to the left-hand side inductor 01 where the switch 02 is series-connected to the self-inductance coil 04 and therefore the switch resistance fully contributes to the resistive part of the inductor impedance.

From U.S. Pat. No. 6,549,096 it is known to decrease the magnetic field of an inductor by the presence of one or more single loop windings positioned in proximity to the inductor. The single loop windings have open circuits that are selectively closed to magnetically couple the single loop windings to the inductor. Further, it is known to form a switched inductor/varactor tuning circuit by connecting a varactor to the inductor. Thereby different axial and coaxial arrangements of single and multi loop windings of primary and secondary coils are proposed causing maximum magnetic field reduction when closing a loop switch, thus causing maximum inductance change.

The tuning range obtained by the known inductor/varactor tuning circuit is limited. Further the step size of switched inductance is relatively coarse.

SUMMARY OF THE INVENTION

It is an object of the invention to present an inductor with a wide tuning range.

It is a further object of the invention to present an inductor with improved granularity of switched inductance.

It is a still further object of the invention to present an inductor with improved area consumption.

According to a first aspect of the invention, an inductor is provided including a primary coil coaxially arranged and operated in parallel with one or more isolated secondary coils, each including at least one loop winding with two open-circuited ports. The inductor has at least one phase shifting device arranged between open-circuited ports of at least one secondary coil. By arranging a phase shifting device between open-circuited ports of a secondary coil the mutual inductance becomes a function of the phase shift and hence the phase shifting device allows tuning the overall inductance of the switchable inductor.

Thus, if a phase shifter device is used to connect open-circuited ports of a secondary coil, a very fine tuning, i.e. a very fine inductance step size or, depending on the implementation of the phase shifter device, even a continuous variation of mutual inductance and thus of the overall inductance of the inductor, can be achieved.

A second aspect of the invention relates to a method of operating an inductor by combining primary and secondary coils with phase shifting devices to get a wide tuning range, wherein the method includes the step of phase shifting open-circuited ports of at least one secondary coil. By phase shifting open-circuited ports of a secondary coil the mutual inductance becomes a function of the phase shift and hence the overall inductance of the switchable inductor can be tuned.

The foregoing, together with other objects, features, and advantages of this invention can be better appreciated with reference to the following specification, claims and drawings.

DETAILED DESCRIPTION OF THE PREFERRED EMBODIMENTS

Figure 1:
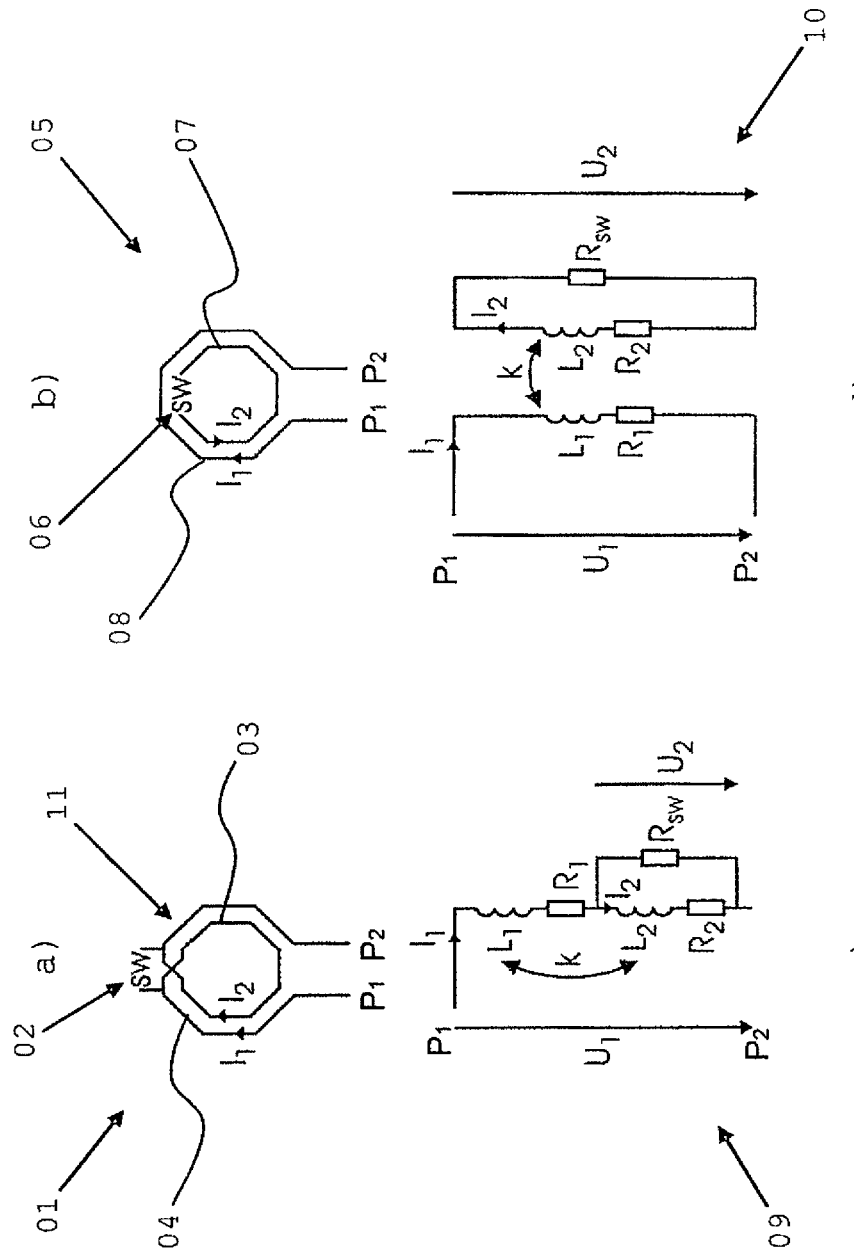
FIG. 1: shows schematic depictions and circuit diagrams of two prior-art types of switchable inductor coils.

According to an embodiment of the first aspect of the invention the inductor includes active coupling structures arranged between the primary coil and at least one secondary coil and/or between at least two secondary coils to selectively parallel couple the primary coil and at least one secondary coil and/or to selectively parallel couple at least two secondary coils. By active parallel coupling two coaxially arranged coils, i.e. by electrically parallel connecting the primary coil and at least one secondary coil and/or at least two secondary coils with each other, the inductance varies compared to the inductance of one of the coils, as well as to the inductance of both coils. Thus an intermediate inductance is generated allowing a reduction of the step size of the switchable inductance. Thus a tunable inductor according to the invention provides a wide inductance tuning range by applying active coupling structures between one or several secondary coils and/or one primary coil. An active coupling structure may be implemented e.g. by means of one or more switches.

According to an embodiment of the invention the active coupling structures are arranged perpendicular or substantially perpendicular to the primary coil and to at least one secondary coil and/or to at least two secondary coils.

According to an embodiment of the first aspect of the invention active coupling structures are arranged between the primary coil and at least one secondary coil and/or between at least two secondary coils, to selectively cross couple the primary coil and at least one secondary coil and/or to selectively cross couple at least two secondary coils.

By active cross coupling two coaxially arranged coils, like e.g. two secondary coils, i.e. by electrically cross connecting two coaxially arranged coils like e.g. the primary coil and at least one secondary coil and/or at least two secondary coils with each other, the inductance varies compared to the inductance of one of the coils as well as to the inductance of both coils. Thus an intermediate inductance is generated allowing a reduction in the step size of the switchable inductance.

According to an embodiment of the first aspect of the invention at least one passive coupling structure in the form of at least one coupling coil is arranged between the primary coil and a secondary coil and/or between two secondary coils, said coupling coil includes at least one loop winding with two open-circuited ports between which a switch is arranged to selectively close the loop winding of said coupling coil, wherein said coupling coil is not coaxially arranged to said primary and secondary coils, but radially displaced, so that the whole coupling coil is lying between adjacent loop windings of two secondary coils and/or between adjacent loop windings of the primary coil and a secondary coil.

By passively coupling the primary coil and at least one secondary coil and/or at least two secondary coils, i.e. by magnetically coupling the primary coil and at least one secondary coil and/or at least two secondary coils when closing the switch between the open-circuited ports of a coupling coil, the mutual inductance of the inductor is changed and thus the overall inductance is varied in intermediate steps resulting in a finer granularity of tuning steps.

Thus a tunable inductor according to the invention provides a wide inductance tuning range by an application of active and/or passive coupling structures between one or several secondary coils and/or one primary coil.

According to an embodiment of the invention a phase shifting device is arranged between the open-circuited ports of at least one coupling coil.

According to a further embodiment of the invention a series connection of at least one phase shifting device and at least one active coupling structure is arranged between the open-circuited ports of at least one secondary coil.

According to a further embodiment of the invention a phase shifting device is arranged in parallel to an active coupling structure between open-circuited ports of a secondary coil and/or a coupling coil.

According to a further embodiment of the invention the primary coil includes neither an active coupling structure nor a phase shifting device. In other words, neither an active coupling structure nor a phase shifting device is series-connected to the primary coil. Because of the better quality factor performance for equal inductance value, the switchable inductor with wide tuning range having neither an active and/or passive coupling structure nor a phase shifting device series-connected to the primary coil applies the concept of switching mutual inductances to tune the overall inductance used in the LC-tank of an oscillator without switches that are series-connected to the self-inductance or primary coil.

By a combination of the above presented embodiments of the invention the shortcomings of the prior art are overcome and additional advantages may be provided through the provision of a switchable inductor including a primary self-inductance coil operated in parallel to one or a plurality of isolated secondary coils that reduce the overall inductance of the switchable inductor by the application of a) phase shifting devices within open-circuited ports of secondary coils and/or coupling coils to reduce the inductance step size or in the extreme case to even continuously tune the overall inductance of the switchable inductor within a certain range. A continuously tunable inductor represents e.g. a varindor.

b) parallel-coupling switch constellations to obtain tuning steps of the inductance, in particular coarse tuning steps, c) cross-coupling switch constellations to obtain further tuning steps of the inductance, in particular coarse tuning steps, d) the application of additional coupling structures, i.e. passive coupling structures, within the secondary coils to reduce the step size of the switchable inductance.

An inductor according to an embodiment of the invention can achieve a refinement of inductance tuning by using phase shifting devices between two open-circuited ports of secondary coils. A wide inductance tuning range can be reached by additionally providing active and passive coupling structures within one or several secondary coils and one primary coil.

Figure 2:
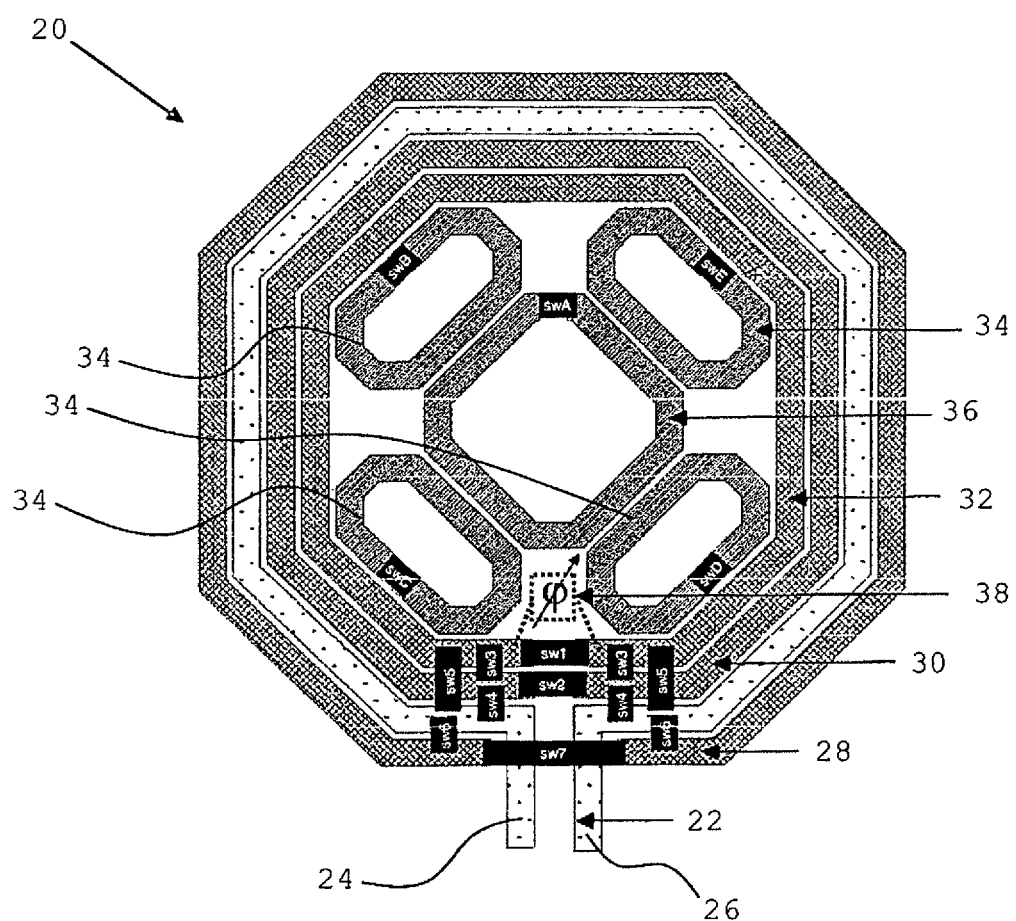
FIG. 2: shows a top view of a switchable inductor according to an embodiment of the invention including primary and secondary coils combined with active and passive coupling structures and phase shifting devices.

Referring to FIG. 2, an exemplary embodiment of a tunable inductor according to the invention is shown. The switchable inductor 20 shown in FIG. 2 includes the following components. There is one primary coil 22 with ports 24 and 26 that are to be connected to a LC-tank or to a remaining part of a LC VCO, respectively. This primary coil 22 provides the self-inductance of the switchable inductor 20. In addition to the primary coil 22 there is one outer secondary coil 28 and a first and a second inner secondary coil 30, 32. These coils 28, 30, 32 contribute to the mutual inductance that reduces the self-inductance. The overall inductance seen at the ports 24 and 26 can be expressed as $$L = L_{primary\_coil} - \Sigma M_{secondary\_coils},$$

where M denotes the mutual inductance produced by the induced currents flowing in the secondary coils 28, 30, 32.

In FIG. 2 only one outer secondary coil 28 is used because the magnetic flux defined as $$\Phi = \iint \vec{B} \cdot d\vec{S}$$

is primarily focused on the inner enclosed section of the primary coil as a result of the higher magnetic field B per area S.

The entirety of the three secondary coils 28, 30, 32 and the switches sw1 through sw7 provide a means to coarse tune the inductance of the switchable inductor 20. For reasons of Q-factor degradation as explained above none of the switches sw1 through sw7 are series connected to the primary coil 22.

There may be several different switch constellations provided.

C1) The switches sw1, sw2, sw7 and swA are located between two open-circuited ports of a secondary coil 28, 30, 32, 36 winding. When such a switch sw1, sw2, sw7, swA gets closed, the induced current can flow within the secondary coil 28, 30, 32, 36 and hence a mutual inductance is produced that reduces the self-inductance as explained above. If the switch sw1, sw2, sw7, or swA is opened, no current can flow and the secondary coil 28, 30, 32, 36 does not contribute to the mutual inductance.

C2) The switches sw3 are arranged perpendicular or substantially perpendicular to the secondary coils 28, 30, 32 such that they can be used to switch some of them in parallel. When such a switch sw3 gets closed, two secondary coils 30, 32 are operated in parallel—provided the pertinent switches sw1 and sw2 are closed as well—which means that their mutual inductances add and above all the overall switch resistances transformed to the primary coil 22 become lower because of the parallel connection. This has a positive impact on the Q-factor. An example is given by the switch pair sw3. A pair of switches sw3 is used for the reason of symmetry with respect to the ports 24 and 26.

C3) The switches sw4, sw5, and sw6 are arranged perpendicular or substantially perpendicular to the primary coil 22. When such a switch gets closed, the secondary coil 28, 30, or 32 is operated as a self-inductance coil and no longer as a mutual inductance coil. Examples are given by the switch pairs sw4, sw5 and sw6 in FIG. 2. The overall inductance reduces, ideally by a factor of two, as well as the resistive losses when one of the indicated switch pairs sw4, sw5 and sw6 is closed.

C4) An additional switching constellation is obtained when for instance sw5 is closed and the first inner secondary coil 30 is short-circuited by switch sw2. This configuration allows operating a mutual inductance coil, here the first inner secondary coil 30, in between two self-inductance coils, here the primary coil 22 and the second inner secondary coil 32. An analogous configuration can also be obtained when operating a self-inductance coil between two mutual inductance coils. This would for instance occur if the outer secondary coil 28 is connected in parallel to the first inner secondary coil 30. The switches required for this complementary case are however not included in FIG. 2 in order to keep the illustration simple.

Figure 8:
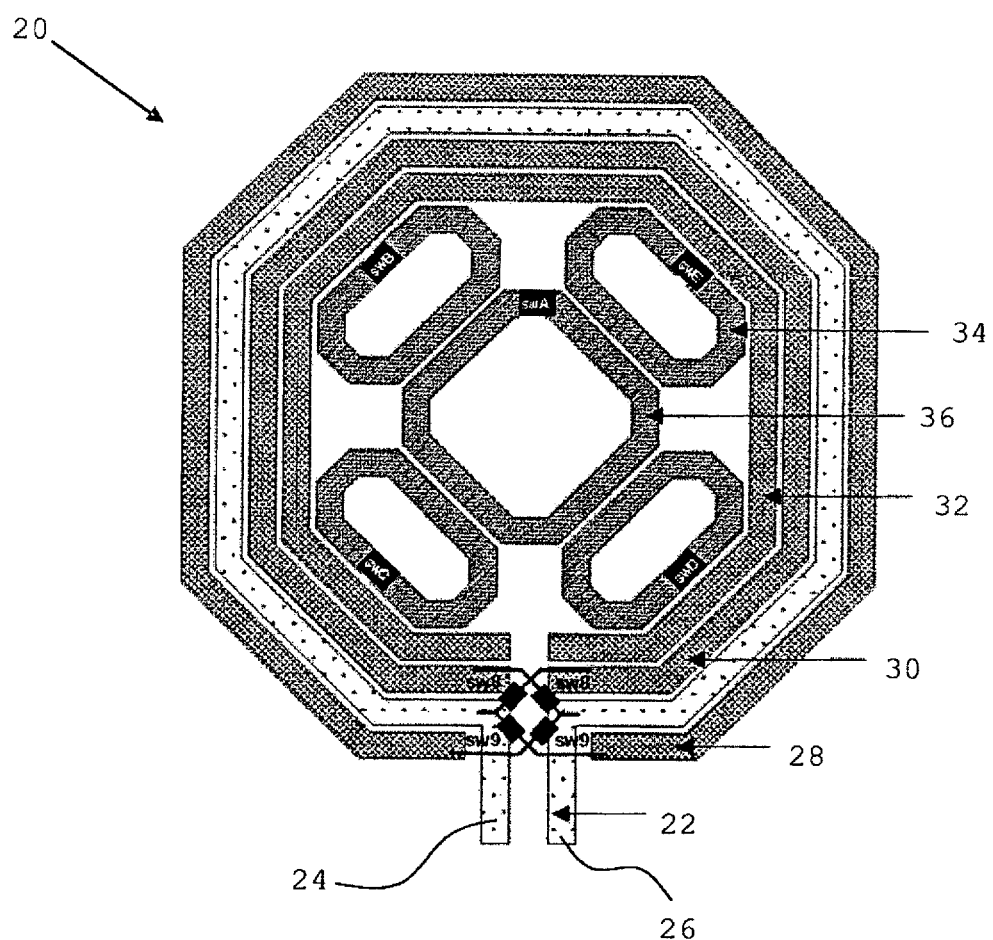
FIG. 8 shows a top view of a switchable inductor consisting of primary and secondary coils combined with active and passive coupling structures and extended with cross-coupled switches.

C5) Another switching constellation for the switchable inductor 20 of FIG. 2 is shown in FIG. 8, where two pairs of crossed switches sw8 and sw9 connect the primary coil 22 with either the first inner secondary coil 30 or the first outer secondary coil 28. If for instance both switches sw8 are closed the first inner secondary coil 30 becomes cross-coupled with the primary coil 22 with respect to the port definition and the coil geometries. The cross-connection forces the current injected into port 24 to be split into two parts to get to port 26. One part is still flowing in the primary coil 22 in a clockwise direction whereas the other part is flowing in the secondary coil 30 in an anti-clockwise direction. Because of the opposed flow directions the effect of reducing the self-inductance of the primary coil 22 by means of the superimposed mutual inductance gets pronounced as the increased mutual inductance not only stems from the magnetically induced current, similar to the magnetic coupling effect described at C1, but also comes from the directly injected current flowing in the opposite direction. The same operation principle also applies to the configuration with the switches sw9 that cross-connect the primary coil 22 with the first outer secondary coil 28. The switches sw1 to sw7 are not shown in FIG. 8 to keep the illustration simple. All three kinds of switches, i.e. the switches sw1, sw2, sw7 and swA short-circuiting the secondary coils 28, 30, 32, 36, the switches sw3, sw4, sw5, sw6 parallel switching coils 22, 28, 30, 32, and the switches sw8, sw9 cross connecting coils 22, 28, 30 within a switchable inductor can be combined in various combinations.

So far the discussed types of switching constellations according to C1) through C5) enable the varying of the overall inductance seen at the ports 24 and 26 in relatively coarse steps.

Figure 3:
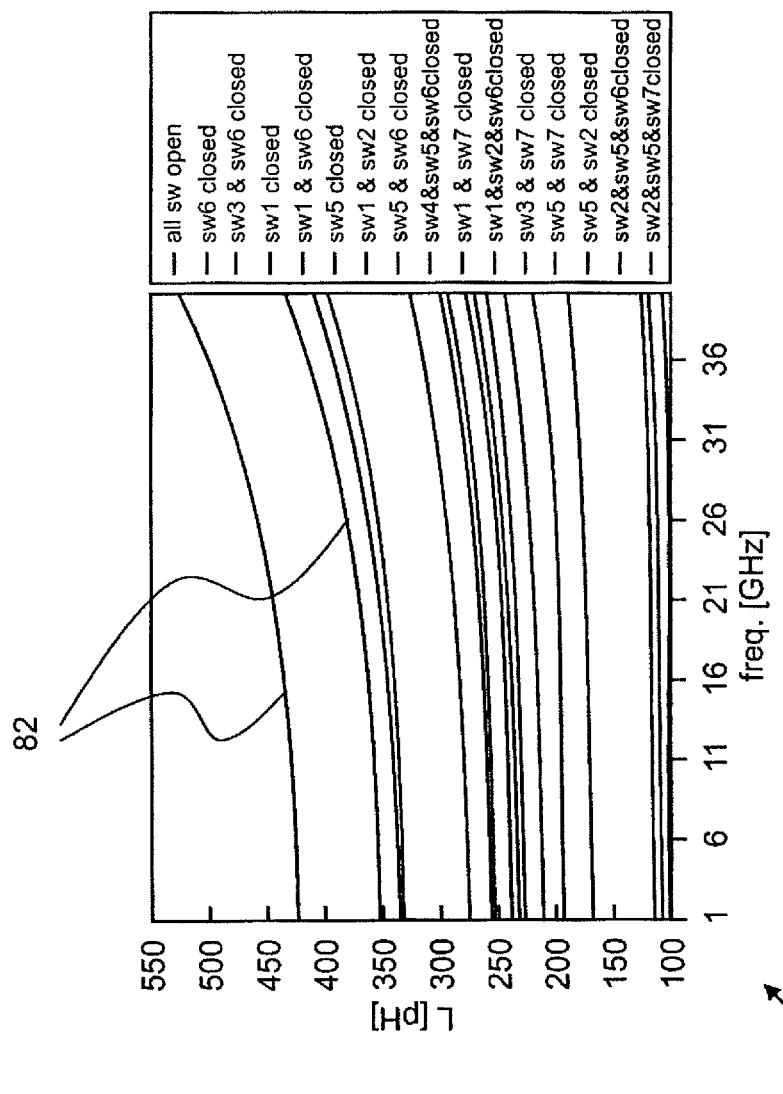
FIG. 3: shows a diagram with coarse inductance settings obtained for various switch combinations of the switchable inductor shown in FIG. 2.

Referring to FIG. 3, an overview of the achievable inductances for the various switching constellations is shown. FIG. 3 shows a diagram 80 with coarse inductance settings obtained for various switch combinations of the switchable inductor 20 shown in FIG. 2. The inductance curves 82 are derived from simulations of the switchable inductor 20 shown in FIG. 2.

Because of the relatively coarse inductance step sizes and the explanations made above about the quality factors of inductors and varactors, it might be desirable to reduce the inductance step size in favor of reducing the number of varactor banks in the LC-tank which, could increase the overall Q-factor of the LC-tank within a certain frequency range.

A method to reduce the inductance step size is given by the inner part of the switchable inductor 20 shown in FIG. 2. It consists of four switchable coupling coils 34 grouped around a third inner secondary coil 36. The idea behind these switchable coupling structures 34 is that they can either be used:
a) to couple a certain amount of mutual inductance generated within the more outer inner secondary coils, e.g. first and second secondary coil 30, 32, to the most inner secondary coil, e.g. the third secondary coil 36.
b) to contribute to the overall mutual inductance by themselves if the inner most secondary coil, e.g. the third secondary coil 36, is open-circuited and only one or more of the coupling coils 34 are closed.

In either case a relatively small variation of changes in mutual inductance can be obtained by partitioning the electromagnetic coupling into four different coupling coil structures 34. Each of the four coupling coil structures 34 shown in this example can maximally convey one quarter of the mutual inductance from the 2nd to the 3rd secondary coil 32, 36 or vice versa and therefore these coupling coil structures 34 are primarily used for fine tuning and filling the gaps in between the coarse inductance step sizes.

Switches swA through swE are arranged within these coupling structures 34 (FIG. 2). If swA through swD are closed, the pertinent coupling coil structures 34 each form a closed loop and an induced current can build up a magnetic field that couples to the next closed secondary coil 32, 36. The switches swA and swD are independent of each other and can be successively closed or opened. The switch swE is of the same type as given at C1) described above.

If applied in combination to the switching constellations C1) through C4) described above, the coarse and fine inductance tuning superimpose and allow a reduction in the inductance step size.

Figure 4:
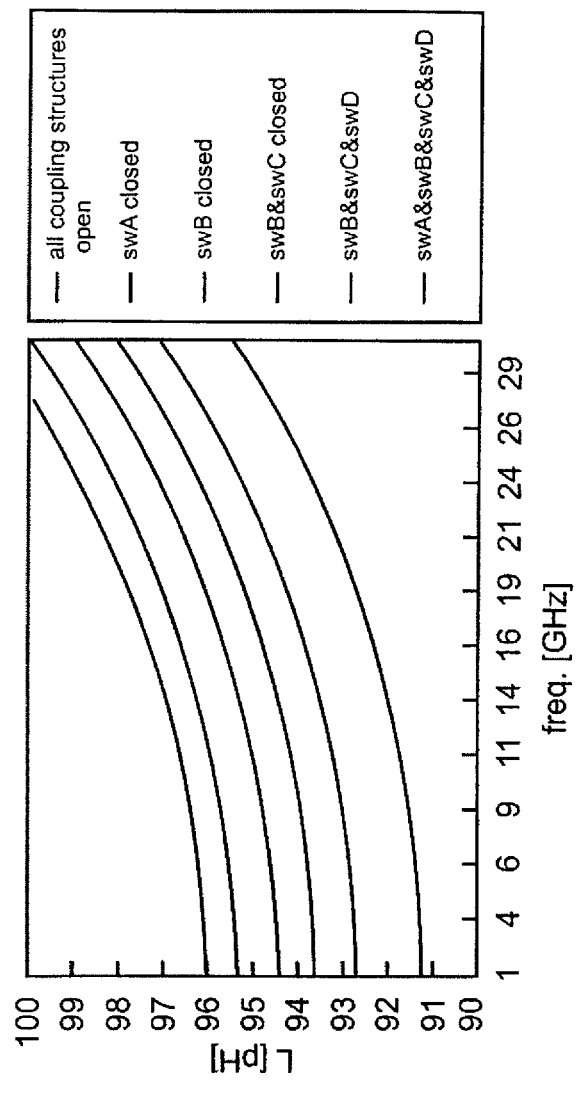
FIG. 4: shows a diagram with fine inductance step sizes obtained for various switch combinations of the coupling structures of the switchable inductor shown in FIG. 2.

An example of an inductance step size refinement using these additional coupling structures is given in FIG. 4, showing a diagram 90 with fine inductance step sizes obtained for various switch combinations of the coupling structures of the switchable inductor 20 shown in FIG. 2, where one of the lower inductor bands of the coarse tuning is further subdivided into smaller step sizes.

The method of using switches according to C1) through C5) to obtain a coarse inductance tuning can be referred to as active coupling. The method of using ring structures to couple between adjacent secondary loops can be referred to as passive coupling. This latter method allows for a reduction in the inductance step size and thus the implementation of a fine tuning of the overall inductance.

In the embodiment according to FIG. 2 a phase shifting device 38, also denoted as phase shifter 38, is connected in parallel to sw1. The phase shifting device 38 is a generic phase shifter for refining the inductor step size.

If the switch sw1 is open, the phase shifter 38 connects the open-circuited ports of e.g. the 2nd secondary coil 32. By means of the phase shifter 38 a very fine inductance step size or—depending on the actual implementation of the phase shifter 38—even a continuous variation of mutual inductance can be achieved. This can be explained by the vector of magnetic field given as $$\vec{B} = \mu \vec{H} \approx \frac{\mu I_2 \cdot \sin(\omega \cdot t + \varphi)}{2\pi r} \vec{e}_r$$

where $I_2$ is the induced sinusoidal electric current. If the phase of $I_2$ is changed by a series connected phase shifter 38 as indicated in the above formula by the phase shift $\varphi$ in the argument of the sin-function, the magnetic flux responsible for the mutual inductance also changes correspondingly.

Figure 5:
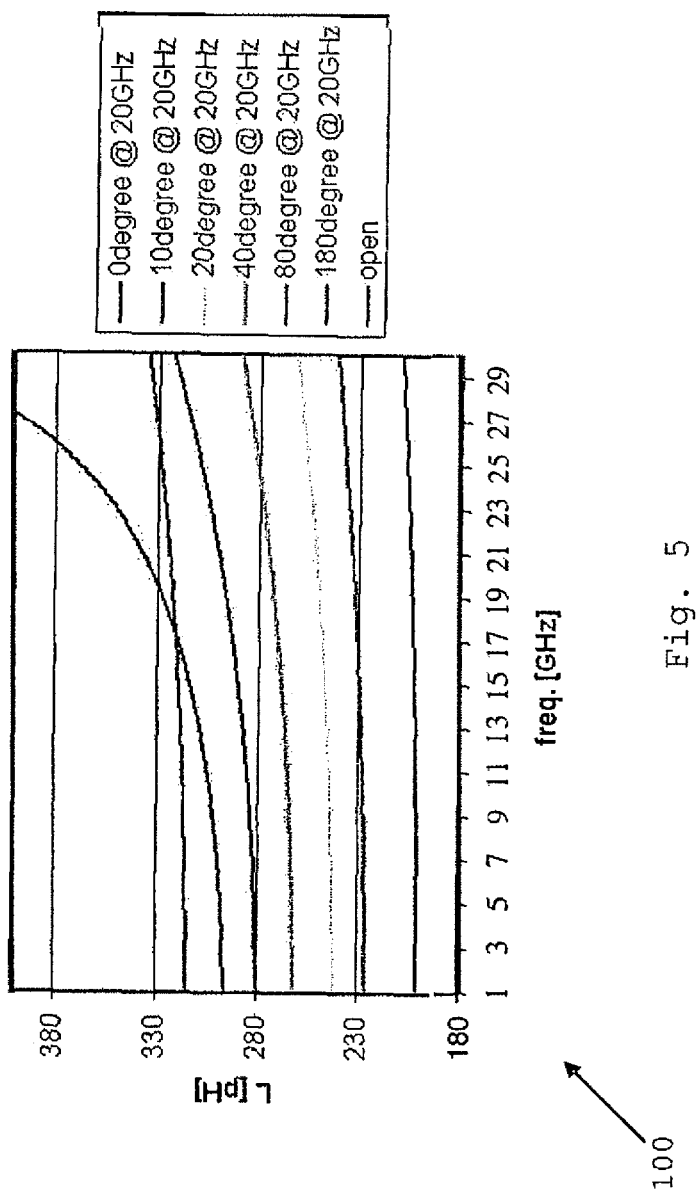
FIG. 5: shows a diagram with different inductance step sizes of the switchable inductor shown in FIG. 2 obtained for various amounts of phase shifts.

Referring to FIG. 5, a simulation where the phase shifter 38 is represented by an ideal transmission line whose length is changed to obtain different phase shifts is shown. FIG. 5 shows a diagram 100 with different inductance step sizes of the switchable inductor 20 shown in FIG. 2 obtained for various amounts of phase shifts.

Figure 6:
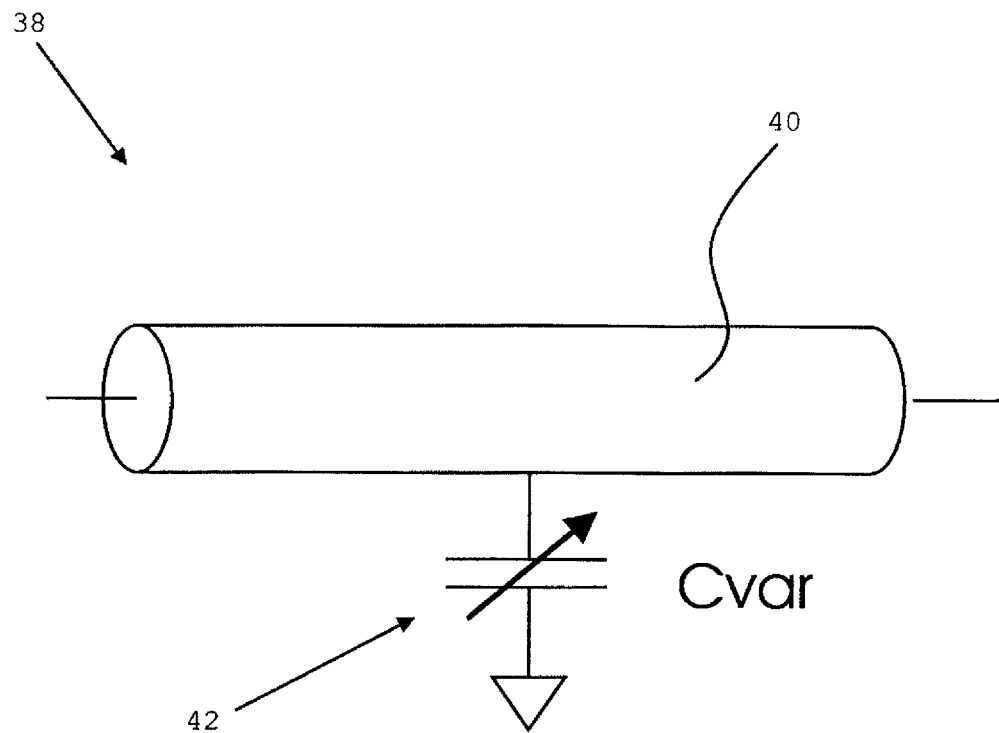
FIG. 6: shows a schematic depiction of a transmission line phase shifter.

An alternative implementation of an electrically tunable transmission line 40 phase shifter 38 is given in FIG. 6, where the amount of phase shifting is varied by the variation of the shunt-connected capacitance 42 in the middle of the transmission line 40.

The application of a phase shifter 38 is not restricted to the case shown in FIG. 2 and can e.g. be used in between any two ports of a secondary coil 28, 30, 32, 36, 34 where a switch sw7, sw2, sw1, swA, swB, swC, swD, swE is located in the embodiment described above.

Figure 7:
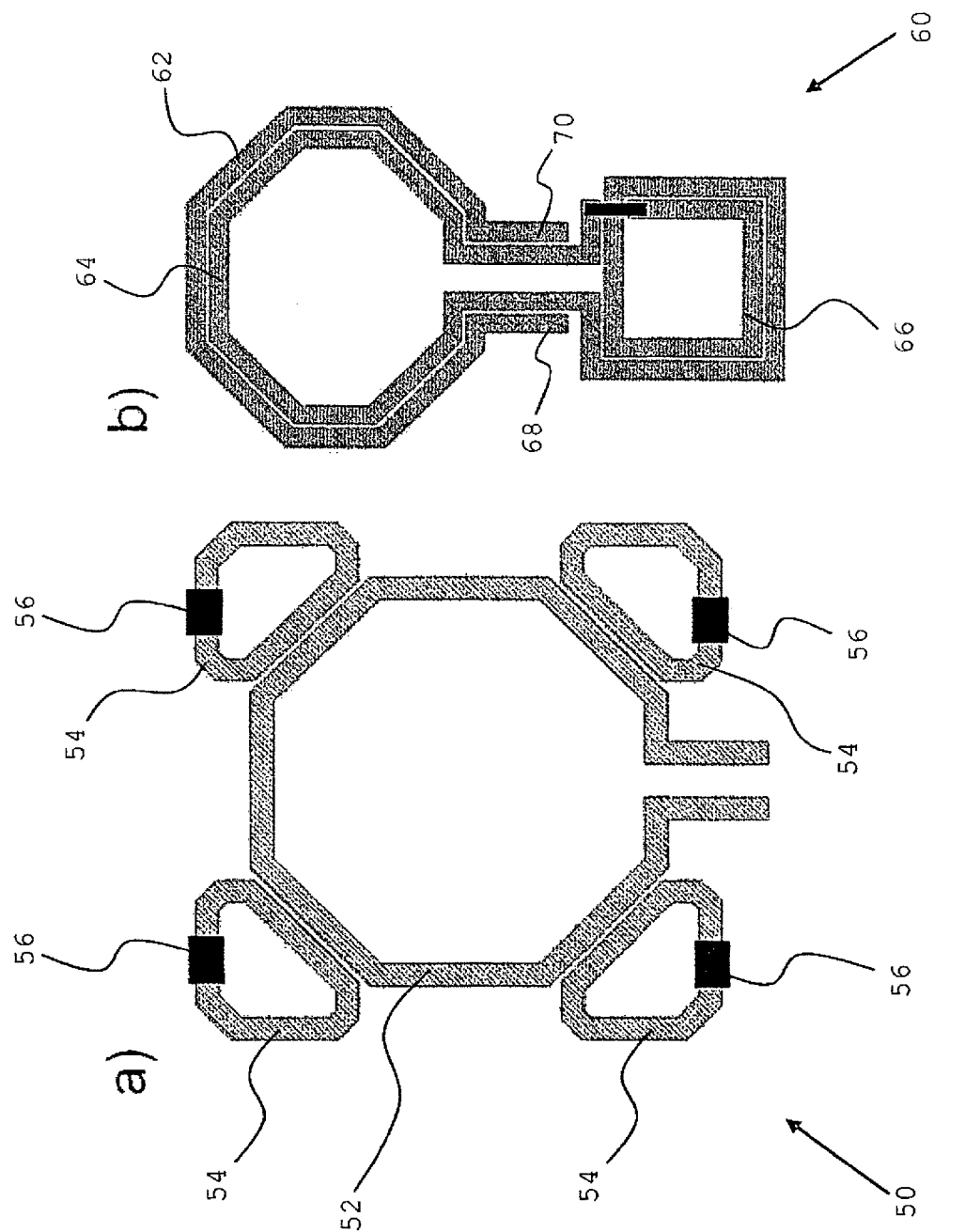
FIG. 7: shows schematic depictions of alternative implementations of switchable mutual inductances, with FIG. 7*a*) showing a primary coil with switchable coupling coils located in each of the four corners and FIG. 7*b*) showing a primary and a secondary coil where the later is additionally extended with a self-inductance coil.

FIG. 7 shows alternative implementations of switchable coils 50, 60.

In the switchable coil 50 shown in FIG. 7a) switchable coupling coils 54 are located in the corners of a primary coil 52. When the switches 56 get closed, each individual coupling coil 54 contributes to the mutual inductance according to the magnetic flux flowing through the area defined by its geometry.

In the switchable coil 60 shown in FIG. 7b a primary coil 62 and secondary coil 64 are depicted where the secondary coil 64 is additionally extended by a switchable self-inductance coil 66. The current induced by the mutual inductance between the primary coil 62 and secondary coil 64 also flows through the additional self-inductance coil 66. The amount of total mutual inductance seen in the secondary coil is therefore reduced by the amount of additional self-inductance. If the self-inductance coil 66 in the secondary loop 64 can be made tunable, this allows fine tuning of the overall mutual inductance and hence also a fine tuning of the overall inductance seen at ports 68 and 70.

Figure 9:
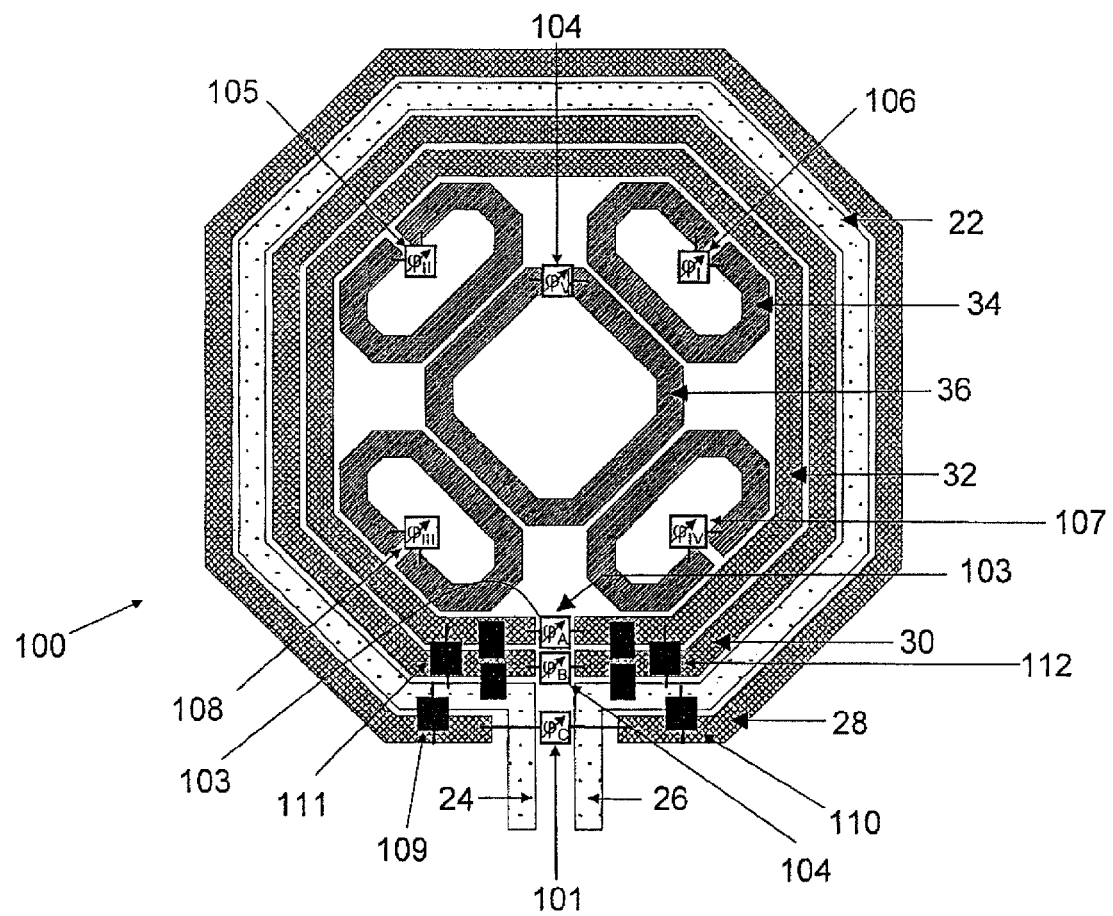
FIG. 9 shows a top view of a switchable inductor similar to the configuration of FIG. 2 including several phase shifting devices.

FIG. 9 shows another inductor 100 according to an embodiment of the invention. The coil arrangement of the inductor 100 corresponds to the coil arrangement of the inductor 20 according to FIG. 2. Accordingly, the coils of FIG. 2 and FIG. 9 are denoted with the same reference numbers. Between the open circuited ports of the outer secondary coil 28 there is arranged a phase shifting device 101, also denoted as $\phi_C$. Between the open circuited ports of the first, the second and the third inner secondary coils 30, 32, and 36 there are arranged phase shifting devices 102, 103 and 104 respectively, also denoted as $\phi_B$, $\phi_A$ and $\phi_V$. Between the open circuited ports of the coupling coils 34 there are arranged phase shifting devices 105, 106, 107 and 108, also denoted as $\phi_I$-$\phi_{IV}$. In addition, phase shifting devices 109 and 110 (also denoted as $\phi_\beta$) are arranged between the primary coil 22 and the outer secondary coil 28 as well as phase shifting devices 111, 112 (also denoted as $\phi_\alpha$) between the primary coil 22 and the inner secondary coil 32.

According to other embodiments of the invention other configurations of phase shifting devices and switches that are not shown may be provided.

According to one embodiment of the invention a series-connection of a phase shifting device and a switch is provided. As an example, the phase shifting device 102 may be directly followed by a switch that allows operating the inner coil 30 in an open-circuited manner despite the existence of the phase shifting device 102. Analogously this may be applied to all other phase shifting devices.

According to another embodiment of the invention cross coupled switches such as the switches sw8 and sw9 of FIG. 8 may be replaced by phase shifting devices and/or pairs of phase shifting devices and switches.

While the present invention has been described in detail, in conjunction with specific preferred embodiments, many alternatives, modifications and variations will be apparent to those skilled in the art in light of the foregoing description. It is therefore contemplated that the appended claims will embrace any such alternatives, modifications and variations as falling within the true scope and spirit of the present invention.

We claim:
1. An inductor comprising:
 a primary coil coaxially arranged and operated in parallel with at least one isolated secondary coil each comprising at least one loop winding with two open-circuited ports;
 active coupling structures arranged to selectively couple the primary coil and said at least one secondary coil by electrically connecting the primary coil and said at least one secondary coil; and
 at least one phase shifting device is arranged between open-circuited ports of said at least one secondary coil.
2. The inductor according to claim 1, wherein at least two secondary coils and active coupling structures are arranged between the primary coil and said at least two secondary coils, to selectively cross couple the primary coil and said at least two secondary coils.
3. The inductor according to claim 2, wherein at least one passive coupling coil is arranged between the primary coil and one of the at least two secondary coils, said at least one passive coupling coil comprising at least one loop winding with two open-circuited ports between which a switch is arranged to selectively close the loop winding of said at least one passive coupling coil, wherein said passive coupling coil is not coaxially arranged to said primary and secondary coils but radially displaced, so that the whole coupling coil lies between adjacent loop windings of two secondary coils and/or between adjacent loop windings of the primary coil and one of the at least two secondary coils.
4. A method to operate an inductor by combining primary and secondary coils with phase shifting devices to get a wide tuning range, the method comprising the steps of:
 selectively coupling a primary coil and at least one secondary coil by electrically connecting the primary coil and said at least one secondary coil; and
 phase shifting open-circuited ports of said at least one secondary coil.
5. The method according to claim 4, wherein said selectively coupling comprises selectively coupling at least two secondary coils by electrically connecting said at least two secondary coils.

* * * * *